United States Patent [19]
Park et al.

[11] Patent Number: 6,043,165
[45] Date of Patent: *Mar. 28, 2000

[54] METHODS OF FORMING ELECTRICALLY INTERCONNECTED LINES USING ULTRAVIOLET RADIATION AS AN ORGANIC COMPOUND CLEANING AGENT

[75] Inventors: Young-hun Park; Sung-hoon Ko; Jong-seob Lee, all of Kyungki-do, Rep. of Korea

[73] Assignee: Samsung Electronics Co., Ltd., Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/890,578

[22] Filed: Jul. 9, 1997

[30] Foreign Application Priority Data

Oct. 28, 1996 [KR] Rep. of Korea ................ 96-49351

[51] Int. Cl.[7] .................. H01L 21/31; H01L 21/469
[52] U.S. Cl. .................. 438/759; 438/963; 438/940; 438/631; 438/626
[58] Field of Search .................. 438/940, 963, 438/624, 626, 632, 697, 699, 763; 759/958, 631

[56] References Cited

U.S. PATENT DOCUMENTS

| | | | |
|---|---|---|---|
| 5,198,388 | 3/1993 | Kawai | 437/173 |
| 5,320,983 | 6/1994 | Ouellet | 437/231 |
| 5,679,211 | 10/1997 | Huang | 156/643.1 |

FOREIGN PATENT DOCUMENTS

| | | |
|---|---|---|
| 0 564 136 A1 | 10/1993 | European Pat. Off. . |
| 0 608 628 A2 | 8/1994 | European Pat. Off. . |
| 63-31137 | 2/1988 | Japan . |
| 2-100342 | 4/1990 | Japan . |
| 5-243402 | 9/1993 | Japan . |
| 6-216264 | 8/1994 | Japan . |
| 08153707 | 11/1996 | Japan . |
| 2 295 723 | 6/1996 | United Kingdom . |

OTHER PUBLICATIONS

Wolf et al., "Silicon Processing for the VLSI Era:Vol. 1–Process Technology", Lattice Press, 1986, p. 564.

Holber, W. et al., "Laser Desorption of Polymer in a Plasma Reactor," Applied Physics Letters, vol. 52, No. 15, Apr. 11, 1988, pp. 1204–1206.

Vines L. B. et al., "Interlevel Dielectric Planarization with Spin–on Glass Films," Proceedings of the International VLSI Multilevel Interconnection Conference, Santa Clara, Jun. 9–10, 1986, pp. 506–515.

Rapport De Recherche, 9706985000, Oct. 16, 1998.

*Primary Examiner*—Richard Booth
*Assistant Examiner*—David A. Zarneke
*Attorney, Agent, or Firm*—Myers Bigel Sibley & Sajovec

[57] ABSTRACT

Methods of forming electrically interconnected lines using organic compound cleaning agents include the steps of forming a first electrically conductive line on a substrate and then forming a first electrically insulating layer on the first electrically conductive line to electrically isolate the first conductive line from adjacent regions and lines. An organic spin-on-glass (SOG) passivation layer is then formed as a planarization layer on the first electrically insulating layer. The organic SOG layer is then etched-back to define a first etched surface thereon, using a carbon-fluoride gas which also preferably contains argon. The organic SOG layer may even be sufficiently etched back to expose an upper surface of the first electrically insulating layer. The first etched surface is then exposed to an organic compound cleaning agent so that organic residues can be removed from the etched surface so that layers subsequently formed on the etched surface are less susceptible to lift-off and flaking. The organic compound cleaning agents preferably consist of ultraviolet radiation and/or an oxygen containing plasma. After the first etched surface has been cleaned, the first electrically insulating layer is patterned to define a via therein which exposes an underlying portion of the first electrically conductive line. A second electrically conductive line (e.g., second level metallization) is then preferably formed in ohmic contact with the exposed portions of the first electrically conductive line and the ohmic contact therebetween is preferably free of organic residues which might adversely affect contact reliability and resistance.

20 Claims, 7 Drawing Sheets

METHODS OF FORMING ELECTRICALLY INTERCONNECTED LINES USING ULTRAVIOLET RADIATION AS AN ORGANIC COMPOUND CLEANING AGENT

FIELD OF THE INVENTION

The present invention relates to methods of forming integrated circuits and more particularly methods of interconnecting electrically conductive lines on integrated circuit substrates.

BACKGROUND OF THE INVENTION

Multilevel wiring and interconnect formation on semiconductor substrates play a significant role in determining overall semiconductor device operating speed, device yield and reliability. Reliance on the reliability of multilevel wiring and interconnects has also increased with the trend towards increased device integration in highly integrated circuits. Methods of forming multilayered wiring lines on semiconductor substrates typically include planarization steps to increase resolution and depth-of-focus during photolithography processing steps. In particular, conventional planarization steps which include the use of spin-on-glass (SOG) passivation layers are relatively simple and economical and are therefore widely used in methods of forming multilayered wiring lines.

Planarization steps using spin-on-glass passivation layers typically include a baking step which is performed at temperatures in a range between about 150 and 400° C. The baking step is typically performed to dry off solvents and moisture from within the spin-on-glass passivation layer. Unfortunately, during the baking step, the spin-on-glass passivation layer may shrink and develop tensile stresses therein. In particular, when the spin-on-glass passivation layer has a thickness greater than about 3,000 Å, the magnitude of the tensile stresses may be sufficient to cause fine cracks in the spin-on-glass layer. To inhibit the formation of such fine cracks, a compound containing an organic group such as a methyl group ($CH_3^-$) or a phenyl group ($C_6H_5^-$) is typically added to the spin-on-glass passivation layer. Spin-on-glass passivation layers containing such organic groups are typically referred to as organic SOG. Prior to the use of organic SOG passivation layers, SOG passivation layers free of organic groups (hereinafter referred to as inorganic SOG passivation layers) were used because of the volatility and difficulty in retaining the organic compounds in the SOG passivation layers. However, many of these problems have been overcome and now organic SOG passivation layers are widely used in planarization technologies.

Referring now to FIGS. 1–4, a conventional method of interconnecting electrically conductive lines at different wiring levels will be described. In particular, FIG. 1 illustrates the steps of forming an underlying layer 20, a first lower conductive layer pattern 30a, a second lower conductive layer pattern 30b, a first interlayer dielectric layer 40 and an organic SOG passivation layer 50. Here, the lower conductive wiring line or layer is formed on the underlying layer 20 and the underlying layer 20 is formed on a semiconductor substrate (not shown) and has an uneven surface profile with upper and lower regions. The upper and lower regions will be referred to as first area "H" and second area "L", respectively.

The lower conductive layer patterns are formed on predetermined areas of the underlying layer 20 by patterning a lower conductive layer (e.g., metallization, polysilicon) until the underlying layer 20 is exposed. Here, a first lower conductive layer pattern 30a is formed on the first area H and a second lower conductive layer pattern 30b is formed on the second area L. Subsequently, a blanket first interlayer dielectric layer 40 (e.g., $SiO_2$) is formed on the overall surface of the substrate having the first and second lower conductive layer patterns 30a and 30b formed thereon. As illustrated, the upper surface of the first interlayer dielectric layer 40 is uneven because of the step heights of the first and second lower conductive layer patterns 30a and 30b and the underlying layer 20. An organic SOG layer 50 is then formed on the overall surface of the substrate having the first interlayer dielectric layer 40 formed thereon. The organic SOG layer 50 acts as a planarization layer to reduce the unevenness of the surface topology of the first interlayer dielectric layer 40.

Referring now to FIG. 2, a step of forming a modified organic SOG layer 50a will be described. In particular, a modified organic SOG layer 50a is formed by etching back the overall surface of the organic SOG layer 50 to a predetermined depth until an upper surface of the first interlayer dielectric layer 40 (extending opposite an upper surface of the first lower conductive layer pattern 30a) is exposed. Here, the step of etching back the organic SOG layer 50 is performed to provide an improved planarized surface and to reduce the aspect ratio of a subsequently formed via extending opposite an upper surface of the second lower conductive layer pattern 30b. Since the overall surface of the organic SOG layer 50 is etched back until the first interlayer dielectric layer 40 is exposed, there exists essentially no modified organic SOG layer 50a extending opposite an upper surface of the first lower conductive layer pattern 30a. A carbon fluoride gas such as $CF_4$ or $C_2F_6$ is preferably used to perform the etch back steps. Here, a gas mixture further containing an inert gas such as argon (Ar) is used for producing sputtering effects as a purely chemical reaction does not allow for a smooth etch-back process. After the etch-back step has been performed, first material layers 55 are left as organic residues on the modified organic SOG layer 50a because the Si and O components of the organic SOG layer 50 evaporate away in the form of $SiF_4$ and $CO_2$, while the organic components of the SOG layer 50 are left behind as residues.

Referring now to FIG. 3, the steps of forming a first dielectric layer pattern 40a, an organic SOG layer pattern 50b, and a second dielectric layer pattern 60a will be described. In particular, a second interlayer dielectric layer is formed on the overall surface of the substrate having the modified organic SOG layer 50a formed thereon. Here, the adhesiveness of the second interlayer dielectric layer to the modified organic SOG layer 50a may become severely deteriorated because the first material residues 55 intervene locally between the modified organic SOG layer 50a and the second interlayer dielectric layer. The second interlayer dielectric layer pattern 60a, the organic SOG layer pattern 50b, and the first dielectric layer pattern 40a are then formed to have a first via hole V1 and a second via hole V2 therein by anisotropically etching the modified organic SOG layer 50a and the first interlayer dielectric layer 40 on the first lower conductive layer pattern 30a, and by anisotropically etching the second interlayer dielectric layer, the modified organic SOG layer 50a, and the first interlayer dielectric layer 40 on the second lower conductive layer pattern 30b, using a mixed gas containing a carbon fluoride gas such as $CF_4$ or $C_2F_6$ gas and an inert gas such as argon for bringing about sputtering effects. These first and second via holes expose the first and second lower conductive layer patterns 30a and 30b, respectively.

Because the modified organic SOG layer 50a is formed thicker on the second lower conductive layer pattern 30b, a relatively large amount of organic SOG is typically etched to form the second via hole V2. Therefore, for the same reason that organic residues are left on the modified organic SOG layer 50a of FIG. 2, additional organic residues 65 are deposited on the bottom of the second via hole V2. In contrast, organic residues are not formed on the bottom of the first via hole V1 because all of the modified organic SOG layer 50a was removed from the portion of the first interlayer dielectric layer 40 extending opposite the first lower conductive layer pattern 30a, prior to the etching step.

Referring now to FIG. 4, an upper conductive layer 70 is formed to fill the first and second via holes V1 and V2 on the overall surface of the substrate having the second interlayer dielectric layer pattern 60a, the organic SOG layer pattern 50b, and the first interlayer dielectric layer pattern 40a formed thereon. However, the existence of the second material layer 65 on the bottom of the second via hole V2 may preclude the formation of a reliable ohmic contact between the upper conductive layer 70 and the second lower conductive layer pattern 30b. In addition, the adhesiveness between the organic SOG layer pattern 50b and the second interlayer dielectric layer pattern 60a is weakened due to the first material residues 55, and thus the second interlayer dielectric layer pattern 60a is susceptible to flaking.

Thus, notwithstanding the above described methods, there continues to be a need for improved methods of interconnecting electrically conductive lines on semiconductor substrates.

SUMMARY OF THE INVENTION

It is therefore an object of the present invention to provide improved methods of interconnecting electrically conductive lines on a semiconductor substrate.

It is another object of the present invention to provide methods of forming electrical interconnects for integrated circuits which are free of defects.

It is still another object of the present invention to provide methods of forming electrical interconnects having improved long term reliability characteristics.

These and other objects, features and advantages are provided by methods of interconnecting electrically conductive lines at different wiring levels which include the steps of forming spin-on-glass (SOG) passivation layers containing organic compounds to inhibit tensile-stress cracking therein, and then exposing the passivation layers to organic compound cleaning agents to improve interconnect reliability by eliminating stray organic residues which may occur during processing.

In particular, methods are provided which include the steps of forming a first electrically conductive line (e.g., patterned first level metallization) on a substrate and then forming a first electrically insulating layer on the first electrically conductive line to electrically isolate the first conductive line from adjacent regions and lines. An organic spin-on-glass (SOG) passivation layer is then formed as a planarization layer on the first electrically insulating layer. The organic compounds in the spin-on-glass passivation layer may comprise methyl or phenyl compounds. The organic SOG layer is then etched-back to define a first etched surface thereon, using a carbon fluoride gas which also preferably contains argon. The organic SOG layer may even be sufficiently etched back to expose an upper surface of the first electrically insulating layer. The first etched surface is then exposed to an organic compound cleaning agent so that organic residues (from the organic SOG layer) can be removed from the etched surface and so that layers subsequently formed on the etched surface are less susceptible to lift-off and flaking. The organic compound cleaning agents preferably consist of ultraviolet radiation and/or an oxygen (e.g., $O_2$, $O_3$) containing plasma. After the first etched surface has been cleaned, the first electrically insulating layer is patterned to define a via therein which exposes an underlying portion of the first electrically conductive line. The exposed portion of the first electrically conductive line may also be cleaned of organic residues, if necessary, by exposing the first electrically conductive line to one of the preferred organic compound cleaning agents. A second electrically conductive line (e.g., second level metallization) is then preferably formed in ohmic contact with the exposed portions of the first electrically conductive line. According to the present invention, the ohmic contact formed between the first and second electrically conductive lines is preferably free of organic residues which might adversely affect contact reliability and resistance.

BRIEF OF DESCRIPTION

Figure 1:
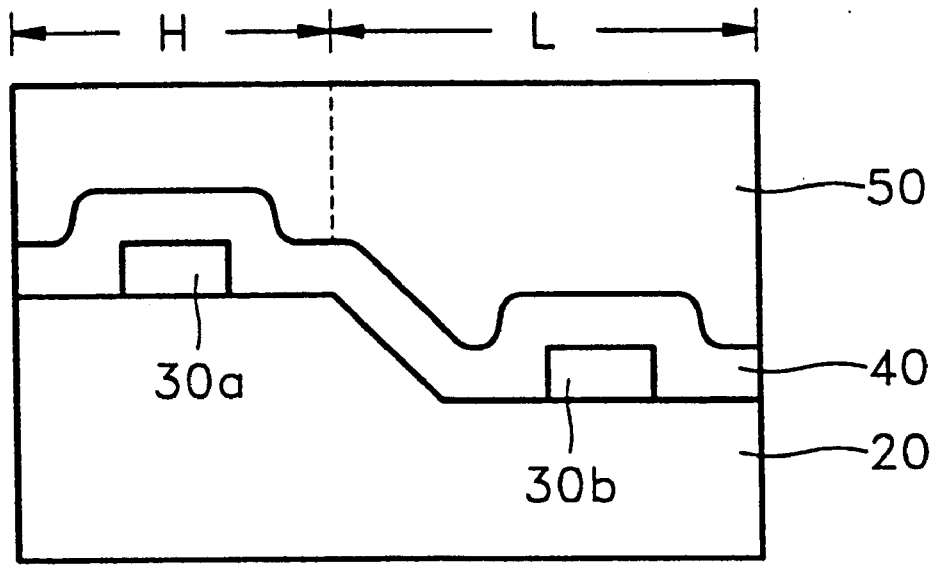
FIGS. 1–4 are cross-sectional views of intermediate structures which illustrate a method of interconnecting electrically conductive lines on a substrate, according to the prior art.
Figure 2:
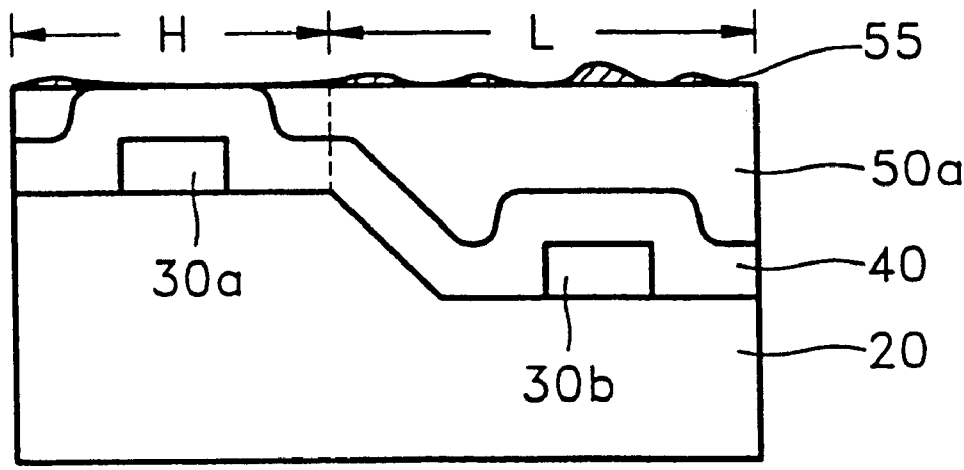

FIGS. 14A, 14B, 15A, and 15B are scanning electron microscope (SEM) pictures for comparing via holes formed according to the conventional art and the present invention.

DESCRIPTION OF PREFERRED EMBODIMENT

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity.

Figure 5:
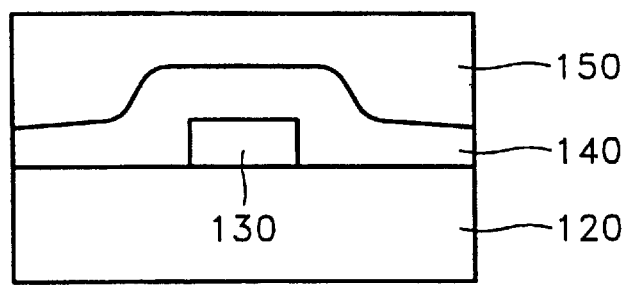
FIGS. 5–7 are cross-sectional views of intermediate structures which illustrate a method of interconnecting electrically conductive lines on a substrate, according to a first embodiment of the present invention.
Figure 6:
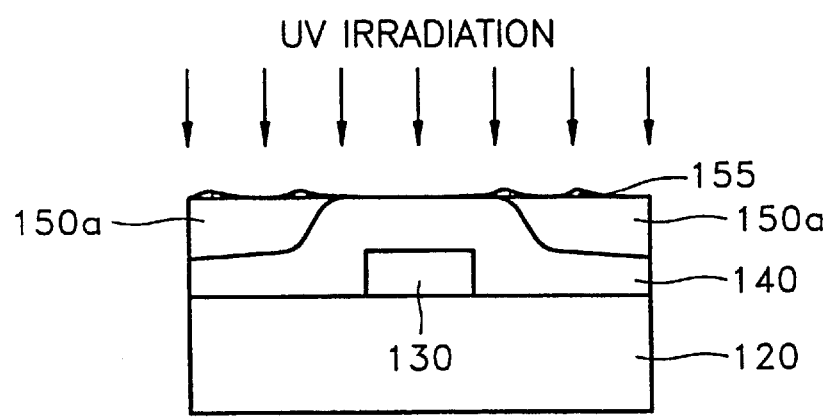
Figure 7:
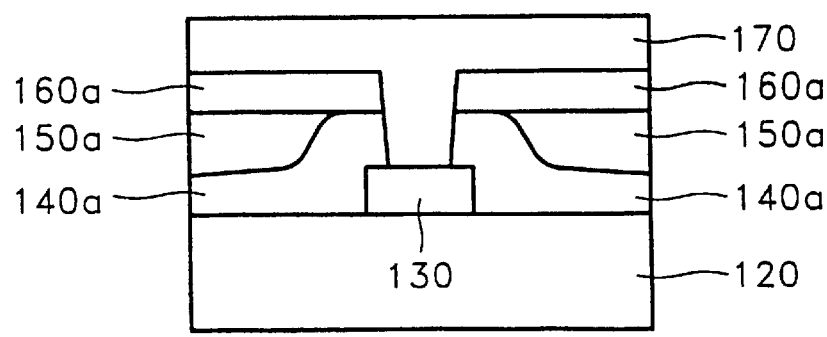

Referring now to FIGS. 5–7, methods of interconnecting electrically conductive lines according to a first embodiment of the present invention will be described. In particular, FIG. 5 illustrates the steps of forming an underlying electrically insulating layer 120 (e.g., silicon dioxide) on a face of a semiconductor substrate (not shown) and then patterning a first conductive layer (e.g., polysilicon, metal) as a first electrically conductive line 130. A first electrically insulating layer 140 (e.g., silicon dioxide) is then formed on an upper surface of the first electrically conductive line 130 and on the underlying electrically insulating layer 120, as illustrated. The first electrically insulating layer 140 may also comprise a composite of at least two electrically insulating layers including a plasma enhance oxide (PEOX) layer having a thickness of about 1,000 Å and a tetra-ethyl-orthosilicate ($O_3$-TEOS) layer having a thickness of about 5,000 Å. The topology of an upper surface of the first electrically insulating layer 140 generally follows the contours of the underlying electrically insulating layer 120 and the first electrically conductive line 130.

Figure 8:
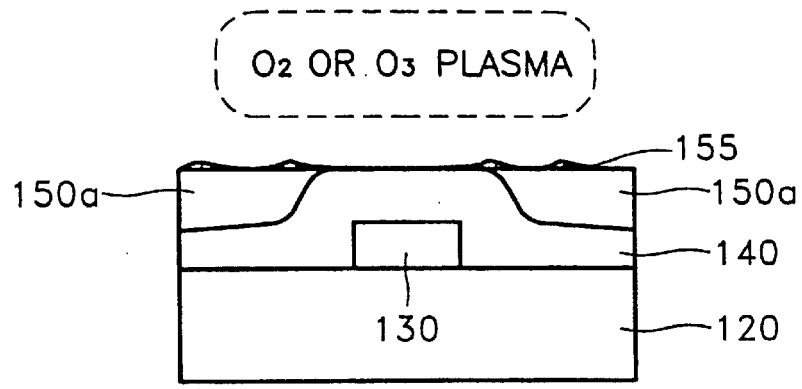
FIG. 8 is a cross-sectional view of an intermediate structure which when combined with FIGS. 5 and 7 illustrates a method of interconnecting electrically conductive lines on a substrate, according to a second embodiment of the present invention.

Next, an organic spin-on-glass (SOG) layer 150 is formed on the first electrically insulating layer 140, as illustrated. Preferably, the organic SOG layer 150 contains methyl or phenyl compounds, for example. Referring now to FIG. 6, the organic SOG layer 150 is then etched-back to define a substantially planar etched surface and expose an upper surface of the first electrically insulating layer 140, using a gas containing carbon and fluorine, such as $CF_4$ or $C_2F_6$, and an inert element such as argon to bring about sputtering effects. After etching, the modified organic SOG layer 150*a* may have a thickness in a range between about 3,000–6,000 Å. The modified organic SOG layer 150*a* is then preferably exposed to an organic compound cleaning agent, such as ultraviolet radiation, to remove organic residues 155 therefrom. Here, the surface of the modified organic SOG layer 150*a* is preferably exposed to ultraviolet radiation for a duration in the range between about 10–300 seconds while the substrate is maintained at a temperature in a range between about 100–250° C. As will be understood by those skilled in the art, during the step of etching the organic SOG layer 150, carbon and hydrogen components contained in the organic SOG layer 150 evaporate, thus reducing the volume of the organic SOG layer 150. As a result, fine cracks may be produced in the modified organic SOG layer 150*a*. This phenomenon becomes more serious as the modified organic SOG layer 150*a* becomes thicker. The fine cracks generally take place when the modified organic SOG layer 150*a* is 3,000 Å or thicker. Alternatively, as illustrated by FIG. 8, an oxygen containing plasma (e.g, $O_2, O_3$) may be used as an organic compound cleaning agent according to a second embodiment of the present invention, in place of the ultraviolet radiation step illustrated by FIG. 6.

Referring now to FIG. 7, a second electrically insulating layer is then formed on the etched and cleaned surface of the modified organic SOG layer 150*a* and on the exposed upper surface of the first electrically insulating layer 140. The second electrically insulating layer may comprise a plasma enhanced oxide (PEOX) layer having a thickness in a range between about 1,000–8,000 Å. An anisotropic etching step is then performed to form a contact hole or via which extends through the modified second electrically insulating layer 160*a* and the modified first electrically insulating layer 140*a*, and exposes the first electrically conductive line 130. This etching step may be performing using a mixed gas containing carbon and fluorine, such as $CF_4$ or $C_2F_6$, and an inert gas such as argon for bringing about sputtering effects. According to a preferred aspect of the present invention, the removal of the organic SOG layer 150 from the portion of the upper surface of the first electrically insulating layer 140 extending opposite the first electrically conductive line, reduces the likelihood that organic residues will be deposited on an upper surface of the exposed first electrically conductive line 130 after the anisotropic etching step has been performed. To complete the formation of an electrical interconnect to the first electrically conductive line, a second electrically conductive layer 170 is formed on the modified second electrically insulating layer 160*a* and in the contact hole.

Figure 9:
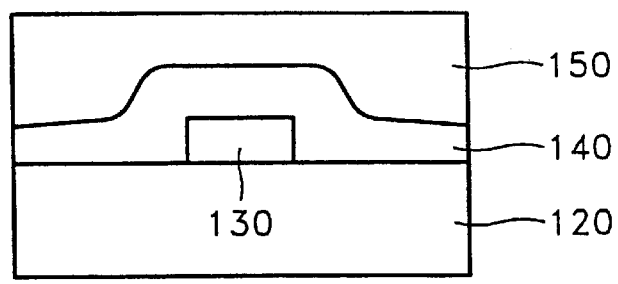
FIGS. 9–12 are cross-sectional views of intermediate structures which illustrate a method of interconnecting electrically conductive lines on a substrate, according to a third embodiment of the present invention.

Referring now to FIGS. 9–12, methods of interconnecting electrically conductive lines according to a third embodiment of the present invention will be described. In particular, FIG. 9 illustrates the steps of forming an underlying electrically insulating layer 120 (e.g., silicon dioxide) on a face of a semiconductor substrate (not shown) and then patterning a first conductive layer (e.g., polysilicon, metal) as a first electrically conductive line 130. A first electrically insulating layer 140 (e.g., silicon dioxide) is then formed on an upper surface of the first electrically conductive line 130 and on the underlying electrically insulating layer 120, as illustrated. The first electrically insulating layer 140 may also comprise a composite of at least two electrically insulating layers including a plasma enhance oxide (PEOX) layer having a thickness of about 1,000 Å and a tetra-ethyl-orthosilicate ($O_3$-TEOS) layer having a thickness of about 5000 Å. The topology of an upper surface of the first electrically insulating layer 140 generally follows the contours of the underlying electrically insulating layer 120 and the first electrically conductive line 130.

Figure 10:
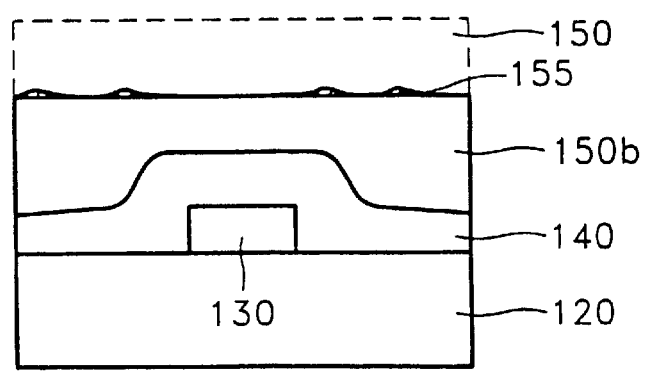

Next, an organic spin-on-glass (SOG) layer 150 is formed on the first electrically insulating layer 140, as illustrated. Preferably, the organic SOG layer 150 contains methyl or phenyl compounds, for example. Referring now to FIG. 10, the organic SOG layer 150 is then etched-back to define a substantially planar etched surface, using a gas containing carbon and fluorine, such as $CF_4$ or $C_2F_6$, and an inert element such as argon to bring about sputtering effects. In contrast to the embodiment illustrated by FIG. 6, the first electrically insulating layer 140 is not exposed during the etch-back step. The modified organic SOG layer 150*b* is then preferably exposed to an organic compound cleaning agent, such as ultraviolet radiation, to remove organic residues 155 therefrom. Here, the surface of the modified organic SOG layer 150*b* may be exposed to ultraviolet radiation for a duration in the range between about 10–300 seconds while the substrate is maintained at a temperature in a range between about 100–250° C. Alternatively, an oxygen containing plasma (e.g, $O_2, O_3$) may be used as an organic compound cleaning agent.

Figure 11:
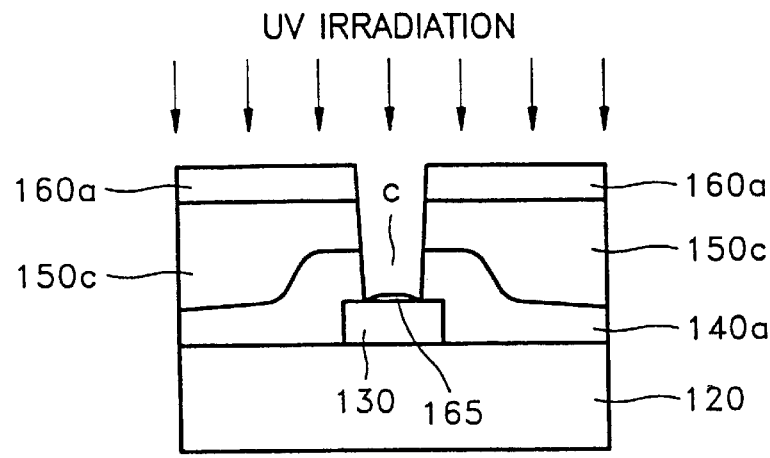
Figure 12:
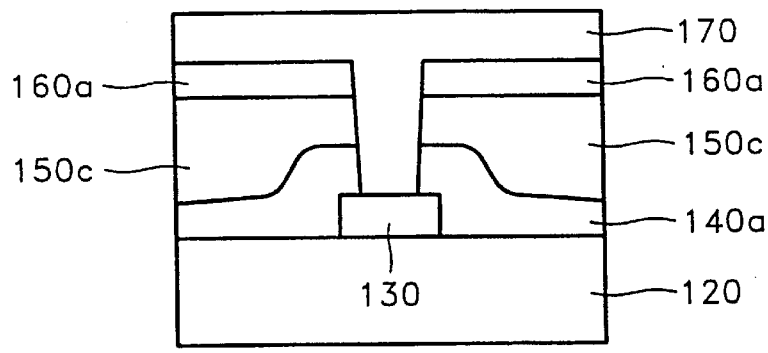
Figure 13:
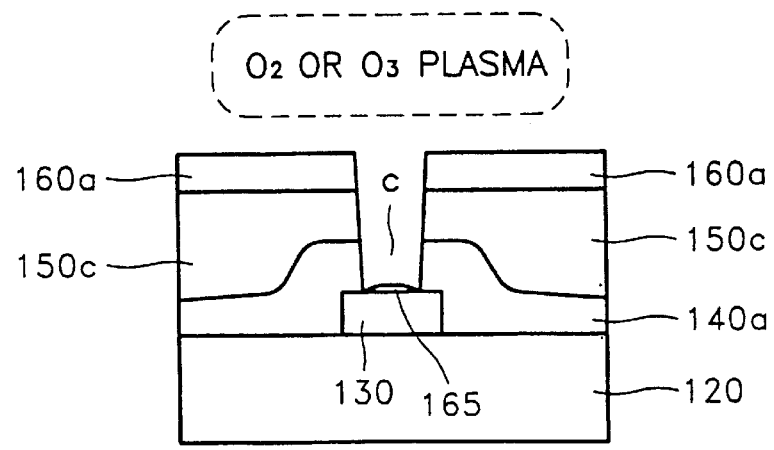
FIG. 13 is a cross-sectional view of an intermediate structure which when combined with FIGS. 9, 10 and 12 illustrates a method of interconnecting electrically conductive lines on a substrate, according to a fourth embodiment of the present invention.

Referring now to FIG. 11, a second electrically insulating layer is then formed on the etched and cleaned surface of the modified organic SOG layer 150*b*. The second electrically insulating layer may comprise a plasma enhanced oxide (PEOX) layer having a thickness in a range between about 1,000–8,000 Å. An anisotropic etching step is then performed to form a contact hole or via "C" which extends through the modified second electrically insulating layer 160*a*, the modified organic SOG layer 150*c* and the modified first electrically insulating layer 140*a*, and exposes the first electrically conductive line 130. This etching step may be performing using a mixed gas containing carbon and fluorine, such as $CF_4$ or $C_2F_6$, and an inert gas such as argon for bringing about sputtering effects. An organic compound cleaning agent may then be exposed to an upper surface of the first electrically conductive line 130 to remove organic residues therefrom. As illustrated best by FIGS. 11 and 13, the organic compound cleaning agent may comprise ultraviolet radiation and/or an oxygen containing plasma. According to a preferred aspect of the present invention, the removal of any organic residues from the first electrically conductive line 130 can be utilized to provide a reliable ohmic contact between the first electrically conductive line 130 and subsequently formed contacts thereto. Referring now to FIG. 12, to complete the formation of an electrical interconnect to the first electrically conductive line, a second electrically conductive layer 170 is formed on the modified second electrically insulating layer 160a and in the contact hole "C".

Figure 3:
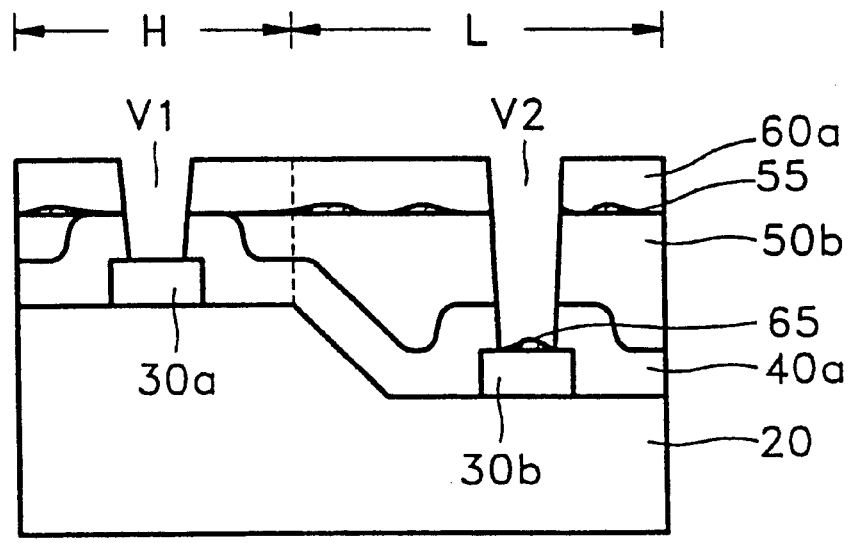
Figure 4:
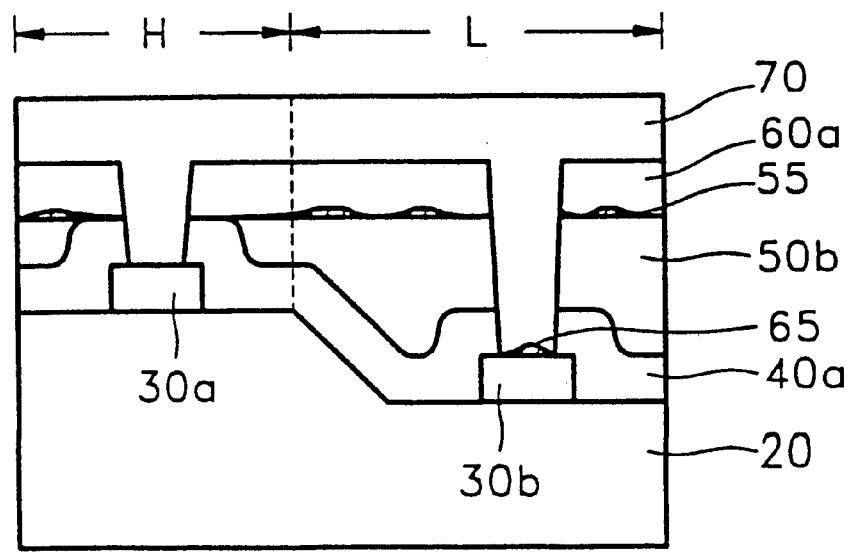
Figure 14A:
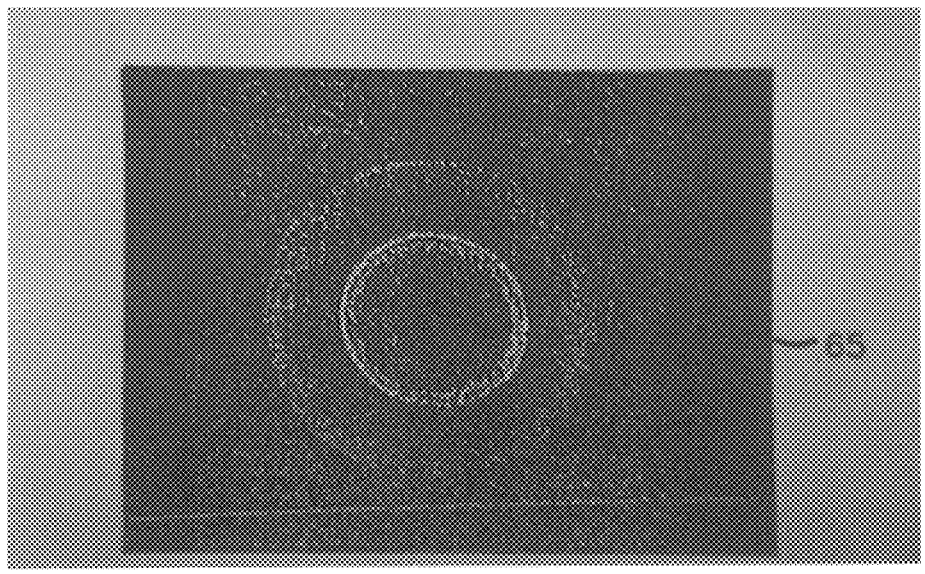
Figure 14B:
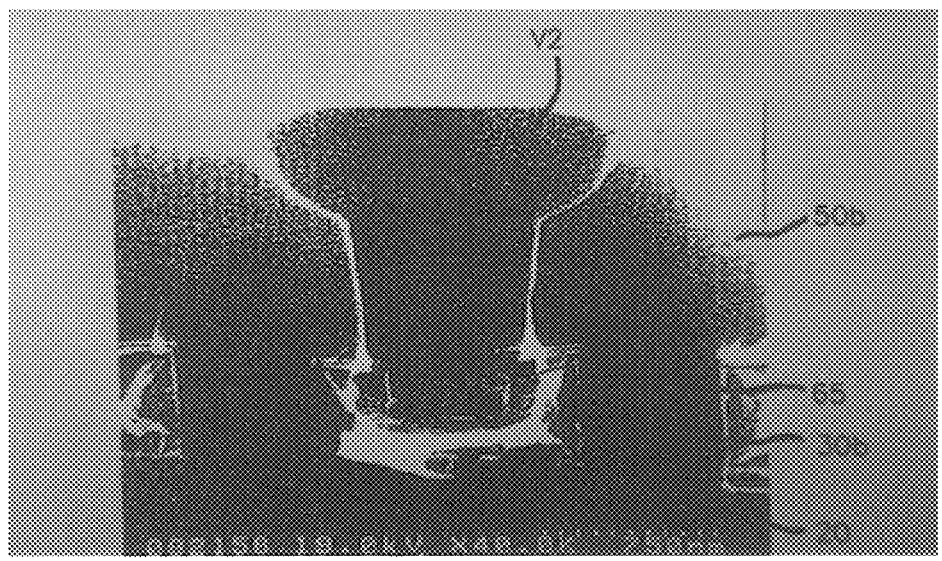
Figure 15A:
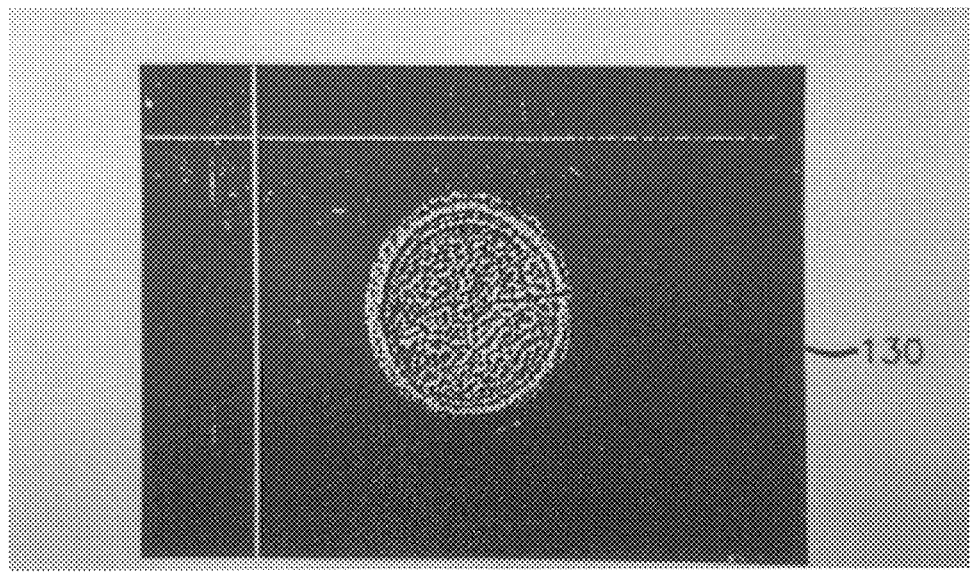
Figure 15B:
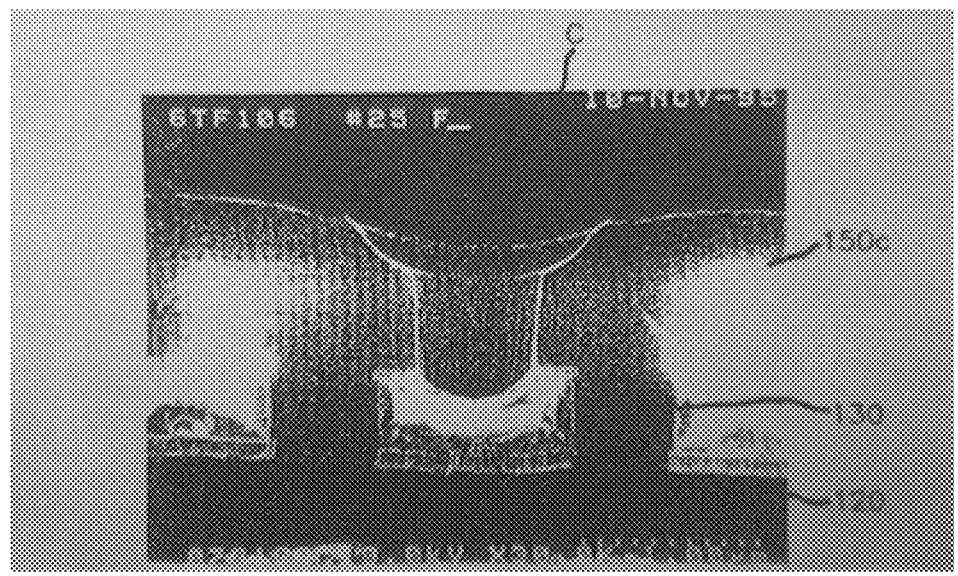

FIGS. 14A, 14B, 15A and 15B are SEM pictures for comparing via holes formed by the conventional art and the present invention. FIGS. 14A and 14B are SEM pictures for explaining the second via hole V2 of FIG. 3. FIGS. 14A and 14B are plan and sectional views of the via hole, respectively. As described above with reference to FIG. 3, the second material layer 65 is observed on the bottom of the via hole V2. FIGS. 1 5A and 1 5B are SEM pictures for explaining the via hole "C" after the step of irradiating ultraviolet rays in FIG. 11. FIGS. 15A and 15B are plan and sectional views of the via hole, respectively. As described above with reference to FIG. 11, the second material layer 165 on the via hole "C" is removed by irradiating ultraviolet rays, and thus the lower conductive layer pattern 130 can be observed to be exposed from the bottom of the via hole "C".

As described above, in the method of electrically interconnecting conductive lines, deterioration of electrical characteristics caused by electrical contact failures between upper and lower conductive layer patterns or flaking of the second interlayer dielectric layer pattern 160a can be prevented by removing the material layers 155 and 165 produced when etching back the organic SOG layer 150 or forming the via hole C, without generating fine cracks in the modified SOG layers 150a–c.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of interconnecting electrically conductive lines on a substrate, comprising the steps of:
    forming a first electrically conductive line on a substrate;
    forming a first electrically insulating layer on the first electrically conductive line;
    forming a first passivation layer on the first electrically insulating layer, opposite the first electrically conductive line;
    etching the first passivation layer to define a first etched surface thereon;
    exposing the first etched surface to ultraviolet radiation to remove organic residues therefrom; and
    patterning the first electrically insulating layer to expose an underlying portion of the first electrically conductive line.

2. The method of claim 1, wherein said etching step comprises etching the first passivation layer to expose a portion of the first electrically insulating layer extending opposite the first electrically conductive line.

3. The method of claim 2, wherein said etching step is followed by the steps of:
    forming a second electrically insulating layer on the first etched surface; and
    wherein said step of patterning the first electrically insulating layer comprises etching the second and first electrically insulating layers in sequence to expose the underlying portion of the first electrically conductive line.

4. The method of claim 1, wherein said etching step is followed by the steps of:
    forming a second electrically insulating layer on the first etched surface;
    wherein said step of patterning the first electrically insulating layer comprises etching the second electrically insulating layer, the first passivation layer and the first electrically insulating layer to expose the underlying portion of the first electrically conductive line.

5. The method of claim 4, further comprising the step of exposing the underlying portion of the first electrically conductive line to ultraviolet radiation to remove organic residues therefrom.

6. The method of claim 5, wherein said step of etching the first passivation layer comprises exposing the first passivation layer to a carbon-fluoride gas; and wherein said step of etching the second electrically insulating layer, the first passivation layer and the first electrically insulating layer is performed using a carbon-fluoride gas.

7. The method of claim 1, wherein said step of exposing the first etched surface to an organic cleaning agent comprises exposing the first etched surface to ultraviolet radiation for a duration in a range between about 10 and 300 seconds while the substrate is maintained at a temperature in a range between about 100 and 250° C.

8. The method of claim 1, wherein said step of forming a first passivation layer comprises forming a spin-on-glass layer containing organic compounds selected from the group consisting of methyl and phenyl compounds.

9. A method of interconnecting electrically conductive lines on a substrate, comprising the steps of:
    forming a first electrically conductive line on a substrate;
    forming a first electrically insulating layer on the first electrically conductive line;
    forming an organic spin-on-glass layer on the first electrically insulating layer;
    etching the organic spin-on glass layer to define a first etched surface thereon;
    exposing the first etched surface to ultraviolet radiation to remove organic residues therefrom;
    patterning the first electrically insulating layer to expose an underlying portion of the first electrically conductive line; and
    forming a second electrically conductive line in contact with the exposed portion of the first electrically conductive line.

10. The method of claim 9, wherein said etching step comprises exposing the organic spin-on-glass layer to a carbon-fluoride and argon containing gas.

11. The method of claim 9, wherein said etching step comprises etching the organic spin-on-glass layer to thereby expose a portion of the first electrically insulating layer extending opposite the first electrically conductive line.

12. The method of claim 11, wherein said etching step is followed by the steps of:
    forming a second electrically insulating layer on the first etched surface; and
    wherein said step of patterning the first electrically insulating layer comprises etching the second and first electrically insulating layers in sequence to expose the underlying portion of the first electrically conductive line.

13. The method of claim 9, wherein said etching step is followed by the steps of:
    forming a second electrically insulating layer on the first etched surface;

wherein said step of patterning the first electrically insulating layer comprises etching the second electrically insulating layer, the organic spin-on-glass layer and the first electrically insulating layer to expose the underlying portion of the first electrically conductive line.

14. The method of claim 13, further comprising the step of exposing the underlying portion of the first electrically conductive line to ultraviolet radiation to remove organic residues therefrom.

15. The method of claim 14, wherein said step of etching the organic spin-on-glass layer comprises exposing the organic spin-on-glass layer to a carbon-fluoride gas; and wherein said step of etching the second electrically insulating layer, the organic spin-on-glass layer and the first electrically insulating layer is performed using a carbon-fluoride gas.

16. The method of claim 9, wherein said step of exposing the first etched surface to an organic cleaning agent comprises exposing the first etched surface to ultraviolet radiation for a duration in a range between about 10 and 300 seconds while the substrate is maintained at a temperature in a range between about 100 and 250° C.

17. A method of forming an interconnecting electrically conductive line on a substrate, comprising the steps of:

forming a first electrically conductive line on the substrate;

forming a first electrically insulating layer on the first electrically conductive line;

forming a planarized electrically insulating layer on the first electrically insulating layer;

forming a second electrically insulating layer on the planarized electrically insulating layer;

forming a contact hole be sequentially etching the second electrically insulating layer, the planarized electrically insulating layer and the first electrically insulating layer to expose an underlying portion of the first electrically conductive line; and exposing the underlying portion of the first electrically conductive line to ultraviolet radiation to provide an ohmic contact between the first electrically conductive line and a second electrically conductive line subsequently formed on the second electrically insulating layer and in the contact hole.

18. The method of claim 17, wherein the step of the planarized insulating layer comprises forming an organic spin-on-glass layer containing organic compounds.

19. The method of claim 17, wherein the step of forming of the planarized insulating layer comprises the steps of:

forming an organic spin-on-glass layer on the first electrically insulating layer;

etching an organic spin-on-glass layer to a predetermined thickness to planarize a surface of the organic spin-on-glass layer.

20. The method of claim 17, wherein the step of exposing the underlying portion of the first electrically conductive line to the ultraviolet comprises the step of removing an organic residue from the underlying portion of the first electrically conductive line.

* * * * *